United States Patent
Walker et al.

(10) Patent No.: US 8,410,583 B2
(45) Date of Patent: Apr. 2, 2013

(54) SECURITY CHIP

(75) Inventors: John Walker, Little Milton (GB); Tony Boswell, Histon (GB)

(73) Assignee: NDS Limited, Staines, Middlesex (GB)

( * ) Notice: Subject to any disclaimer, the term of this patent is extended or adjusted under 35 U.S.C. 154(b) by 330 days.

(21) Appl. No.: 12/733,188

(22) PCT Filed: Aug. 4, 2008

(86) PCT No.: PCT/IB2008/053105
§ 371 (c)(1),
(2), (4) Date: Mar. 23, 2010

(87) PCT Pub. No.: WO2009/031057
PCT Pub. Date: Mar. 12, 2009

(65) Prior Publication Data
US 2010/0207256 A1    Aug. 19, 2010

Related U.S. Application Data

(60) Provisional application No. 60/967,400, filed on Sep. 4, 2007.

(51) Int. Cl.
*H01L 23/552* (2006.01)
*H01L 23/58* (2006.01)
*H01L 21/70* (2006.01)
*H01L 21/00* (2006.01)
*H01L 21/8238* (2006.01)

(52) U.S. Cl. ........ 257/659; 257/664; 257/662; 257/508; 438/121; 438/118; 438/215

(58) Field of Classification Search ............... 257/659, 257/664, 662, 508, 758, 734, 533, 211, 210, 257/773; 438/121, 215, 348, 361, 118
See application file for complete search history.

(56) References Cited

U.S. PATENT DOCUMENTS

| | | | |
|---|---|---|---|
| 4,910,707 A * | 3/1990 | Schrenk | 365/185.04 |
| 2005/0051860 A1 | 3/2005 | Takeuchi et al. | |
| 2006/0183030 A1 | 8/2006 | Nakao | |
| 2007/0080430 A1 * | 4/2007 | Yoshida | 257/662 |

FOREIGN PATENT DOCUMENTS

| | | |
|---|---|---|
| EP | 0 437 376 B1 | 3/1997 |
| JP | 63110646 A | 5/1988 |
| JP | 10-270562 | 10/1998 |
| JP | 2001-284357 | 10/2001 |
| JP | 2003-207850 | 7/2003 |
| JP | 2004-333531 | 11/2004 |
| JP | 2006-166126 | 6/2006 |
| WO | WO 03/102510 A2 | 12/2003 |
| WO | WO 2005/117115 A1 | 12/2005 |

OTHER PUBLICATIONS

Dec. 5, 2011 Office Communication in connection with prosecution of CN 2008 801 05557.4.

* cited by examiner

*Primary Examiner* — Chuong A. Luu
(74) *Attorney, Agent, or Firm* — Hisch Blackwell LLP

(57) ABSTRACT

A security chip is disclosed. The security chip includes: a substrate; an integrated circuit disposed on the substrate, the integrated circuit including circuit elements, circuit interconnect layers connecting the circuit elements together, and interlayer contacts supporting the circuit interconnect layers; a shield to at least partially shield the integrated circuit; and at least one lightwell in the shield and the integrated circuit, wherein each lightwell has a closed shape formed from parts of the circuit interconnect layers and interlayer contacts, wherein no exploitable voltage can be measured on the parts of the circuit interconnect layers and interlayer contacts, and wherein each lightwell forms a path for light to penetrate to the substrate preventing the light from reaching the circuit elements. Related apparatus and methods are also disclosed.

11 Claims, 5 Drawing Sheets

SECURITY CHIP

RELATED APPLICATION INFORMATION

The present application is a 35 USC §371 application of PCT/IB2008/053105, filed on 4 Aug. 2008 and entitled "Security Chip", which was published on 12 Mar. 2009 in the English language with International Publication Number WO 2009/031057 A2, and which relies for priority on U.S. Provisional Patent Application Ser. No. 60/967,400, filed on 4 Sep. 2007.

FIELD OF THE INVENTION

The present invention relates to a security chip and a method of manufacturing a security chip.

BACKGROUND OF THE INVENTION

Security chips (sometimes referred to as security integrated circuits) are used in many products where assets need to be protected. These assets include information, personal details, value (typically monetary), data transmissions and access rights. The assets are protected by various defensive means, each designed to foil attacks on the chip and its assets.

Recently, fault induction attacks on the operation of chips, including differential fault analysis (DFA), have been gaining prominence. A fault induction attack is an attack where the chip is forced to make an error in an operation. Some errors that a chip can be forced to make can be exploited to reveal secret information and the attack is then successful.

A typical fault induction attack uses a flash or pulse of light (e.g. from a pulsed laser) aimed at a small section of the circuit with the aim of disrupting some function, calculation or other operation of the chip. The laser pulse is aimed at a precise location on the chip and within a specific time period during the chip operation. It is speculated that the light pulse causes the CMOS gates in the chip circuit to have an indeterminate output for any determined input. This indeterminate output might, for example, make a branching instruction take the wrong branch, leading to the execution of the wrong software. This incorrect execution might then be exploited to reveal secret information (sensitive data) or to bypass authorisation checks, for example.

One of the main defences against attacks such as those described above is the use of a passive shield.

Passive shields are large flat areas of metal over all or part of the chip circuit and are designed to prevent viewing and probing and make attacks more time consuming. Passive shields are often made from an upper layer of metal interconnects in a multi-layer circuit.

SUMMARY OF THE INVENTION

Defences against fault induction attacks may be implemented in application or operating system software but two problems exist. Firstly, each potential attack must have a unique solution put in place. For example, an attack on a particular point in a cryptographic algorithm may require a completely different solution to an attack on a different algorithm or even an attack on a different point in the same algorithm. Secondly, software defences can be costly in terms of chip performance.

Passive shields could be effective at preventing fault induction attacks by preventing passage of the light/pulse to the chip circuitry underneath the shield. By covering the entire chip, the solution would not depend on the specifics of the attack and there would be no effect on chip performance.

As shown in FIG. 1, the ideal passive shield 101 is a sheet of opaque material (e.g. a metal such as aluminium or copper) covering the entire chip. This would prevent any penetration of a light pulse 102 used to perpetrate fault induction attacks. However, aluminium and silicon dioxide, the two materials most commonly used in chip construction, have very different coefficients of thermal expansion. Changes in temperature lead to a significantly greater expansion of the passive shield 101 in comparison to the silicon dioxide layers (not shown) that encapsulate the aluminium metal layers 103/104/105 and the layers can therefore split apart, or 'delaminate'. This leads to chip failure, either immediately or after a short time as the aluminium metal is exposed to the corrosive effects of the atmosphere.

Delamination may be overcome by making a passive shield composed of limited areas of shield, each of which is sufficiently small such that the stress does not lead to delamination (see FIG. 2). For example, a passive shield may be made of many parallel long narrow strips 201/202 of shield. In this way, 95% of the chip surface (or possibly greater) can be shielded. However, passive shields constructed in this way have paths at the edges of the strips 201/202 through which light 203 can penetrate. Light penetrating the gaps between the strips of shield will undergo diffraction at the edges of the shield. As such, the area of chip circuit accessible to the light is therefore much greater than the area directly under the gaps. Light will bend at the edge of the metal layers and subsequent reflections under the shield ensure that the light penetrates many tens of microns under the passive shielded area. Therefore such passive shields are known not to be effective against fault induction attacks in many cases.

Therefore, existing passive shields may either be mechanically robust to prevent delamination, or effective in stopping light based fault attacks, but not both.

There is provided in accordance with embodiments of the present invention a security chip including: a substrate; an integrated circuit disposed on the substrate, the integrated circuit including circuit elements, circuit interconnect layers connecting the circuit elements together, and interlayer contacts supporting the circuit interconnect layers; a shield to at least partially shield the integrated circuit; and at least one lightwell in the shield and the integrated circuit, wherein each lightwell has a closed shape formed from parts of the circuit interconnect layers and interlayer contacts, wherein no exploitable voltage can be measured on the parts of the circuit interconnect layers and interlayer contacts, and wherein each lightwell forms a path for light to penetrate to the substrate preventing the light from reaching the circuit elements.

In some embodiments, the parts of the circuit interconnect layers and interlayer contacts are connected to a constant voltage circuit element of the integrated circuit.

In further embodiments, the parts of the circuit interconnect layers and interlayer contacts are connected to a ground potential of the integrated circuit.

In other embodiments, the closed shape is a ring.

In some embodiments, the ring is a square ring.

In further embodiments, spaces between the interlayer contacts are sufficiently small to block all visible and infrared light.

In some embodiments, the interlayer contacts are spaced less than or equal to 0.18 microns apart.

In other embodiments, the lightwells have a lightwell width and are separated by a distance greater than or equal to ten times the lightwell width.

In further embodiments, the security chip further includes one or more light sensors at the base of one or more of the lightwells.

In some embodiments, the exploitable voltage comprises a varying voltage wherein the variation in voltage correlates with a sensitive data value.

There is also provided in accordance with a further embodiment of the present invention a method of manufacturing a security chip, the security chip including: a substrate; an integrated circuit disposed on the substrate, the integrated circuit including circuit elements, circuit interconnect layers connecting the circuit elements together, and interlayer contacts supporting the circuit interconnect layers; and a shield to at least partially shield the integrated circuit, the method including forming at least one lightwell in the shield and the integrated circuit, wherein each lightwell has a closed shape and is formed from parts of the circuit interconnect layers and interlayer contacts, wherein no exploitable voltage can be measured on the parts of the circuit interconnect layers and interlayer contacts, and wherein each lightwell forms a path for light to penetrate to the substrate preventing the light from reaching the circuit elements.

BRIEF DESCRIPTION OF THE DRAWINGS

The present invention will be understood and appreciated more fully from the following detailed description, taken in conjunction with the drawings in which.

DETAILED DESCRIPTION OF EMBODIMENTS

The present invention, in embodiments thereof, comprises a security chip that is effective against attack by light or other disrupting media (such as is used in a fault induction attack). The security chip includes a passive shield that is mechanically robust and stable while still preventing access to the chip circuit below the shield. In particular, it addresses the above described problem that gaps in existing passive shield designs do not prevent light penetration at all points on the chip surface. As such, existing passive shield designs are not invulnerable to attack.

Figure 1:
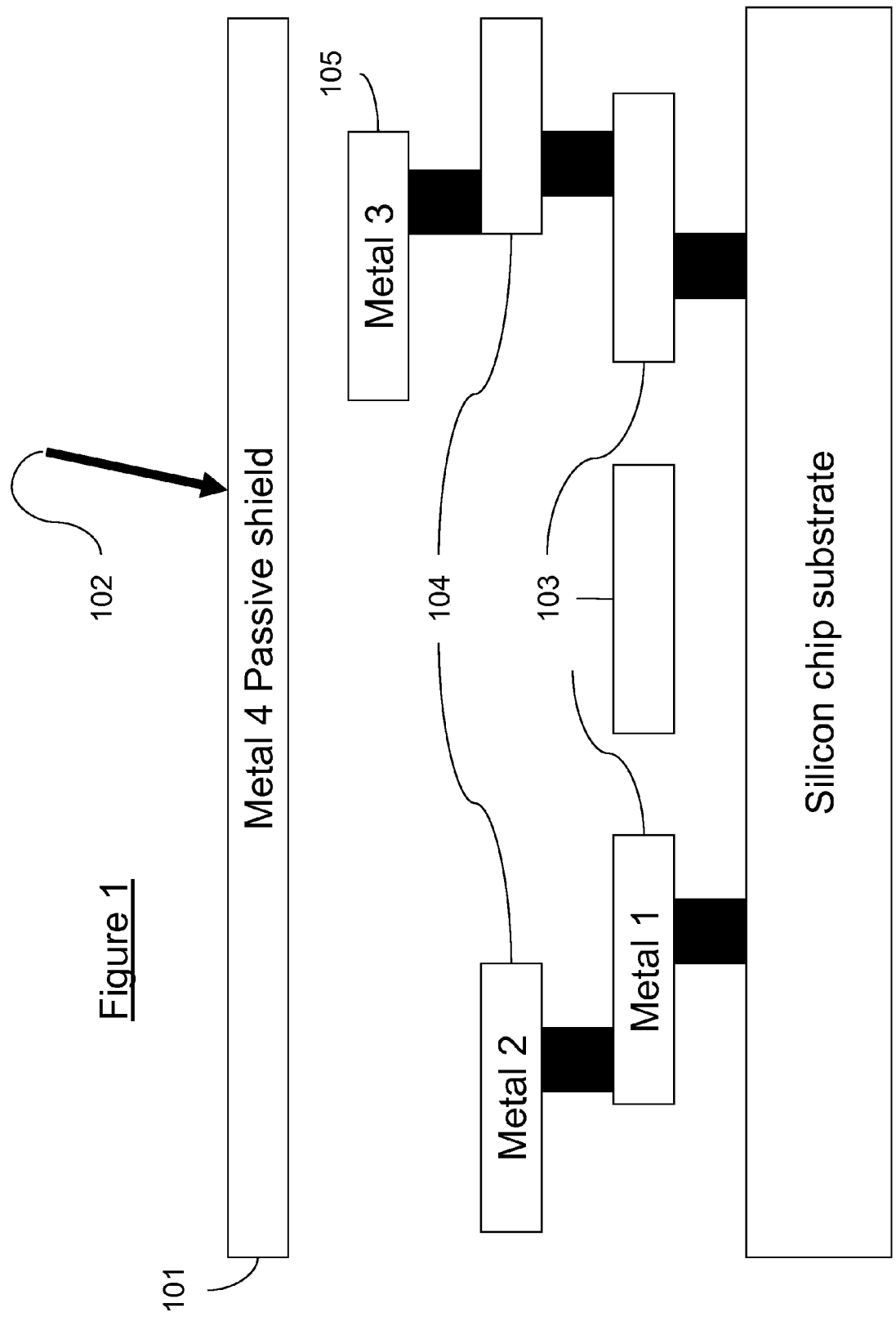
FIG. 1 is a simplified pictorial illustration of a cross sectional view through part of a security chip having a passive shield that covers the entire security chip.
Figure 2:
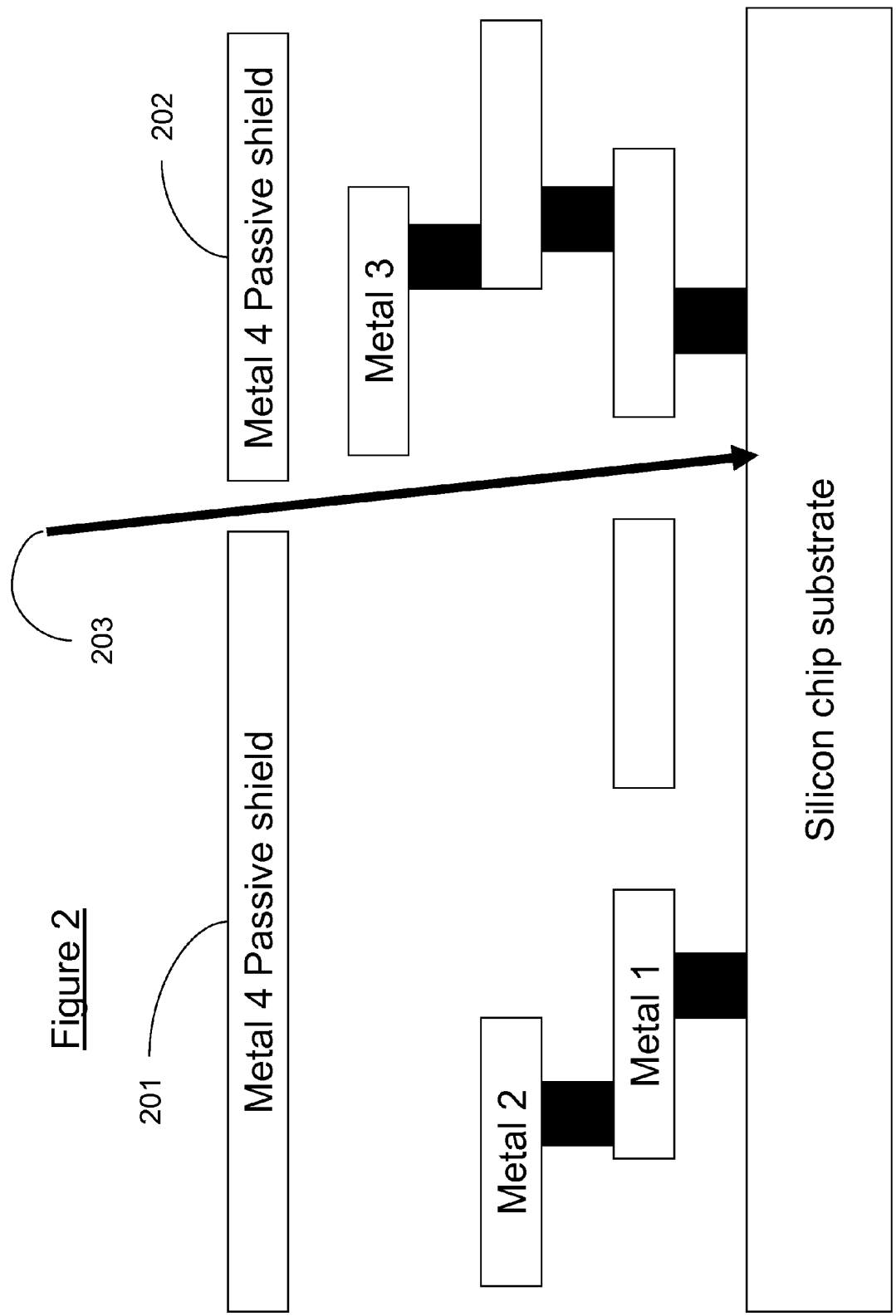
FIG. 2 is a simplified pictorial illustration of a cross sectional view through part of a security chip having a passive shield that covers part of the security chip.
Figure 3:
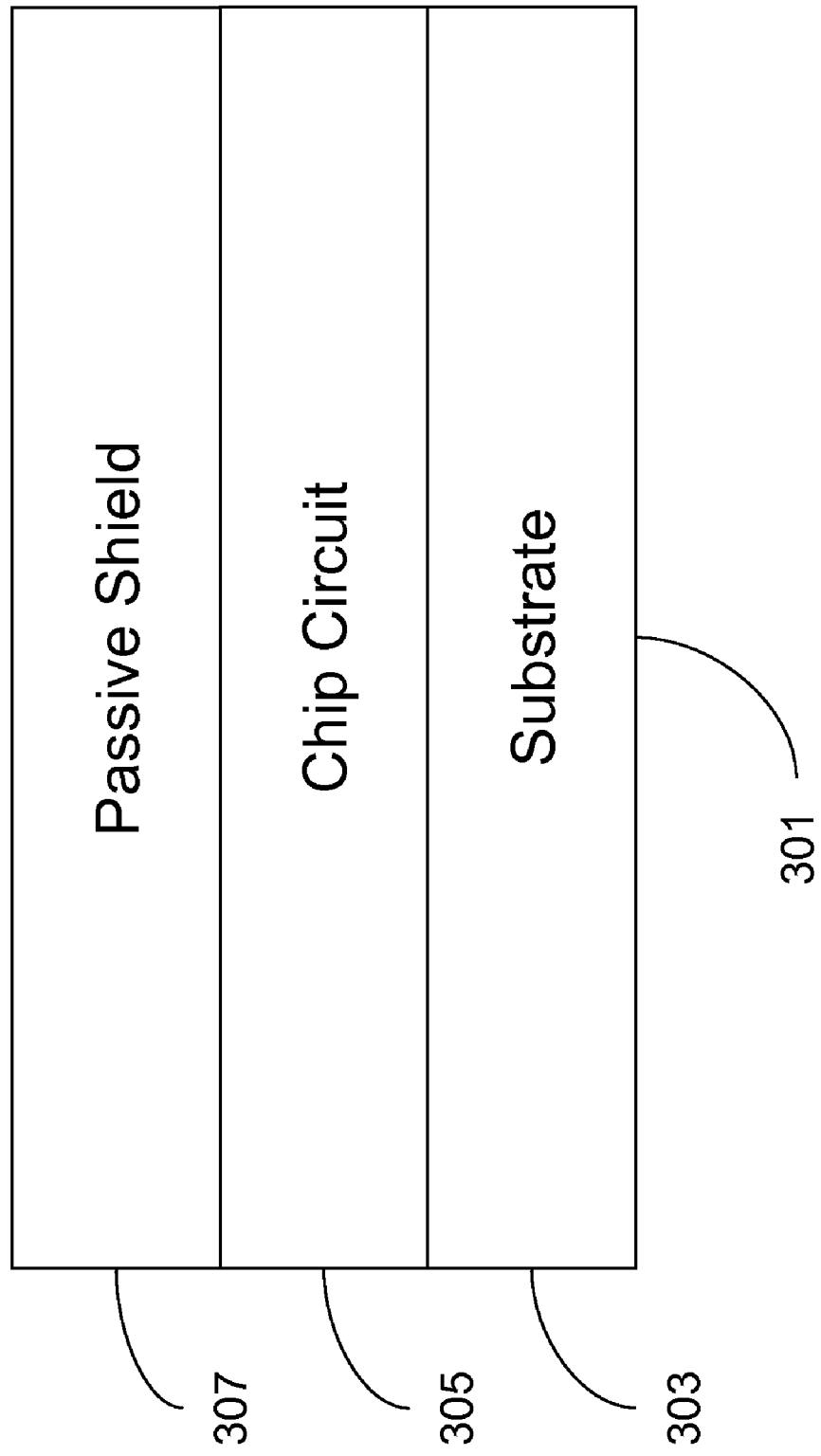
FIG. 3 is a simplified pictorial illustration of a cross sectional view through part of a security chip constructed and operative in accordance with an embodiment of the present invention.

Referring now to FIG. 3 (which is not drawn to scale), a cross-section of a security chip is shown. Security chip 301 typically comprises a substrate 303 (typically made of silicon) which preferably includes an integrated circuit 305 disposed thereon. The terminology 'disposed thereon' is used for the sake of simplicity. However, it will be appreciated by those skilled in the art that integrated circuits are typically formed partially within the chip material, for example, but not limited to, by doping the chip material, and partially on top of the chip material, typically in metal and insulating layers. However, the term 'disposed thereon' as used in the specification and claims is defined to include disposed thereon and/or therein the substrate.

Circuit 305 typically comprises transistors, diodes, interconnections and all well-known circuit elements. Circuit 305 typically covers the majority of substrate 303.

A passive shield 307, constructed from an opaque material (e.g. a metal such as aluminium or copper), is provided over circuit 305. The passive shield prevents light from passing through to the circuit below the shield.

Interspersed throughout circuit 305 are a series of lightwells in the passive shield and the underlying circuit elements. The lightwells are a path in which no passive shield is present and through which light can penetrate to the substrate below. The lightwells therefore act as gaps in the passive shield which maintains maximum strength against delamination for the smallest circuit area used. Additionally, the walls of the lightwell are as impervious to light as possible. This is achieved using parts of the metal layers and interlayer contacts (also called vias or interconnect vias), both of which are typically present in circuits and easily available for use in the design of the new passive shield. The parts of the metal layers that form the walls of the lightwells are areas of the metal layers that are completely separate electrically from the rest of the metal layers. The parts of the metal layers that form the walls of the lightwells are typically connected to a ground potential or to any signal that cannot be exploited in an attack on the chip. An example of a signal that cannot be exploited in an attack on the chip is a varying voltage where the variation in voltage does not correlate with any sensitive data value. Put another way, no exploitable voltage potential can be measured on the parts of the metal layers and interlayer contacts forming the lightwell walls and therefore there would be no advantage to an attacker in probing these parts of the metal layers or interlayer contacts or analysing/measuring the voltage on them. Moreover, no circuit elements are contained within the lightwell (other than an optional light sensor, which will be described in more detail below) and therefore the lightwells prevent light getting to the chip circuit elements and thus prevent a security breach caused by light passing through the passive shield.

Figure 4:
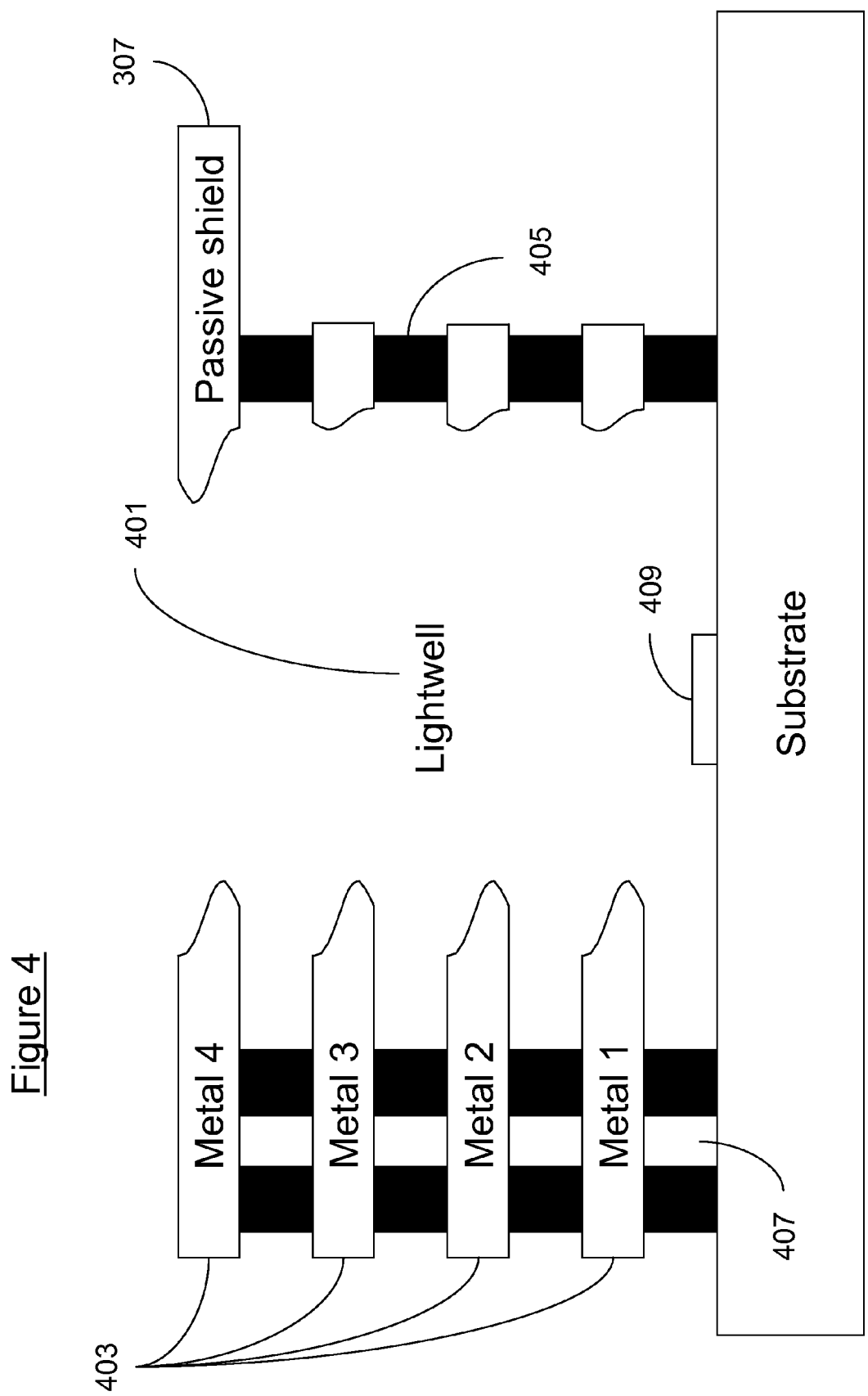
FIG. 4 is a simplified pictorial illustration of a cross sectional view through part of a security chip constructed and operative in accordance with an embodiment of the present invention.
Figure 5:
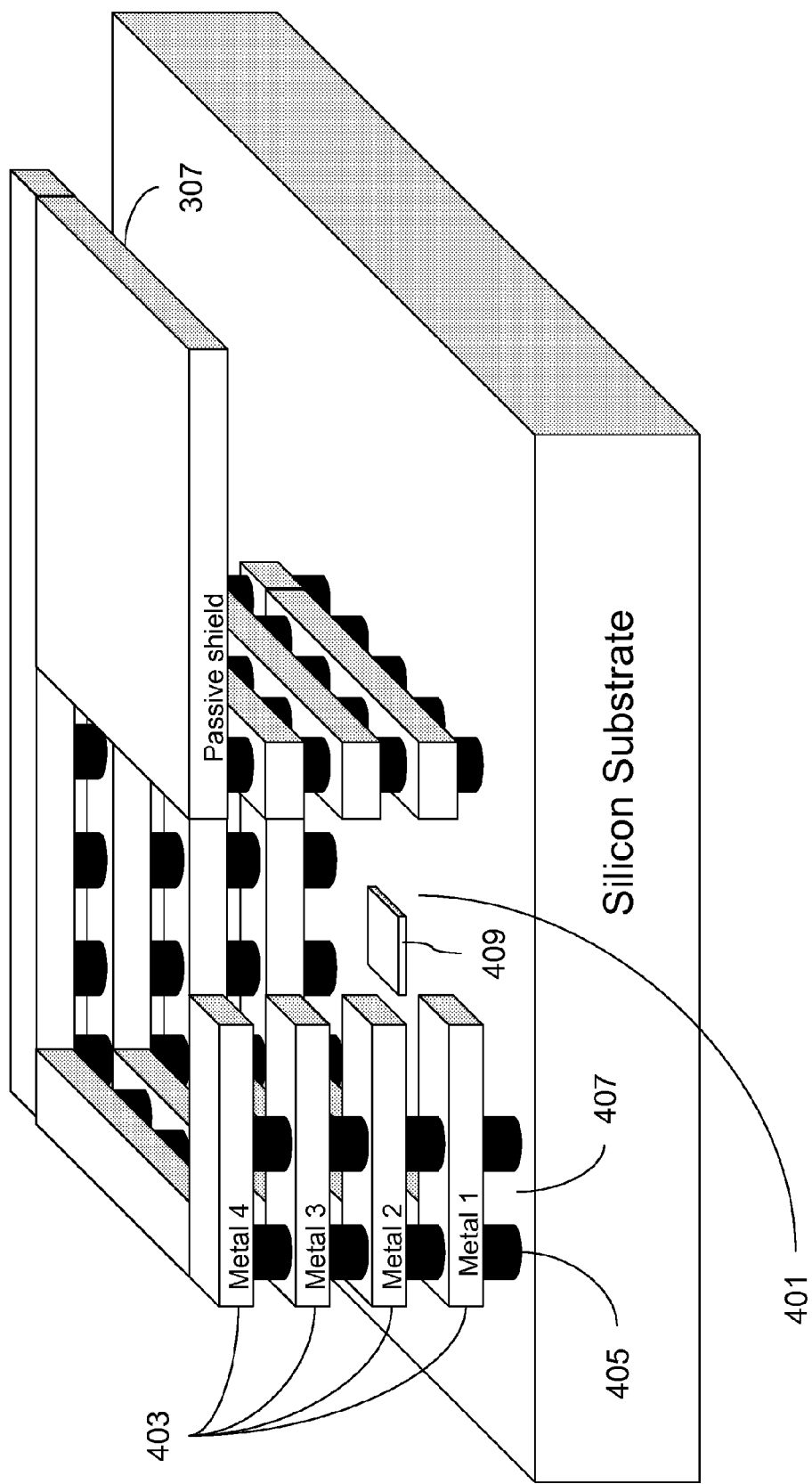
FIG. 5 is a simplified pictorial illustration of a three dimensional view through part of a security chip constructed and operative in accordance with an embodiment of the present invention.

An example of one of the lightwells interspersed throughout circuit 305 is shown in FIG. 4 (cross section) and also in FIG. 5 (three dimensional). The walls of the lightwell 401 are made from rings 403 of circuit interconnect metal (shown in FIG. 5 as square rings, but it will be appreciated that any other closed shape would be suitable). Typically, the circuit interconnect material (as well as the material used for passive shield 307) is metallic (e.g. aluminium or copper). Four layers of metal interconnect are shown in FIGS. 4 and 5 as forming the lightwell 401. The number of layers of metal interconnect can be any number from one up to the total number of metal interconnect layers but is typically one less than the total number of metal interconnect layers used in the circuit.

The rings 403 are supported by closely spaced interlayer contacts 405 (also called vias or interconnect vias) used to connect individual layers of interconnects. There are typically small gaps 407 between vias. Typically, the interlayer contacts are tungsten plugs but other schemes, such as dual damascene interconnects used in copper based circuits are also possible.

The space between the metal interconnects is filed with interlayer dielectric (ILD), although this is not shown in FIG. 4 or 5 for reasons of clarity. ILD is a glass-like material, typically silicon dioxide but other materials may be used. The purpose of the ILD is to support the metal interconnects and hold the entire chip structure together. The ILD is typically transparent and is not conductive. The ILD fills the entire circuit from substrate 303 to above the top metal layer.

Lightwells similar to lightwell 401 are deployed across the entire passive shield area in sufficient number to alleviate mechanical stress in the passive shield layer. The number of lightwells depends on several factors related to the design and manufacturing process of the chips. Typically, the lightwells form a grid over the security chip in areas where lightwell placement is possible. Lightwells are preferably omitted in areas where placement is difficult, such as over memory blocks.

The separation of the lightwells is typically equal to or greater than ten times the lightwell width. This ensures that the chip is mechanically stable (i.e. the circuit can be held together without the danger of delamination) and that the maximum area of the chip lost to lightwells (and therefore unavailable for parts of the chip circuit) is 1% of the total area of the chip. Security chip circuits with areas of passive shield with a minimum dimension of 100 microns have been observed by the inventors. According to the above description of the separation of lightwells, this implies a minimum spacing of 10 lightwells per linear millimetre or 100 lightwells per square millimetre. Lightwells as small as 10 square microns are known by the inventors to be possible, which implies a 'fill-factor' of 1% as mentioned previously.

Unlike previous passive shield designs where light passing the edges of the passive shield can reach the chip circuit underneath the passive shield and thus attack the chip circuit, according to embodiments of the present invention light is confined to the lightwell. Each metal layer 403 of the circuit below passive shield 307 is used to form part of the barrier preventing light penetration to the rest of the circuit. In addition, layer interconnect vias 405, typically columns of tungsten (called tungsten plugs) when using an Aluminium chip manufacturing scheme, further limit or prevent light penetrating from the lightwell to the circuit.

The gaps 407 between the interconnect vias 405 and the gaps between metal layers are typically sufficiently small such that light cannot penetrate through these gaps. Light of a sufficiently small wavelength will penetrate the gaps but the gaps may be made sufficiently small such that light of such wavelengths would be absorbed before it can attack the circuit. For example, the gap between the tungsten plugs used with an Aluminium chip manufacturing scheme is typically 0.18 microns. This is sufficiently small to block all visible and infra-red (IR) light but may not totally block near ultra violet (NUV) light having a wavelength of approximately 250 nm-400 nm. Therefore some light might penetrate between tungsten plugs spaced at 0.18 microns if a NUV laser (typically emitting light with a wavelength of 355 nm) is used. If the gaps between the tungsten plus are reduced to 0.13 microns (as is expected in the future by the inventors as technology shrinks), light penetration becomes unlikely as the short wavelength of light required to penetrate such a gap (i.e. a 255 nm laser) will not penetrate the ILD. Even smaller gaps are also possible (e.g. 0.09 microns, 0.065 microns, 0.045 microns, 0.032 microns and 0.022 microns).

The present invention, in embodiments thereof, can be included in any silicon chip that is manufactured according to methods of making such chips that are well known to someone skilled in the art. Examples of methods of chip manufacture can be found in "*Microchip Fabrication*", Peter Van Zant, ISBN 0071432418, 5$^{th}$ Edition, 2004. The inventors of the present invention are aware of two principal schemes of making silicon chips (more than 99% of chips currently made use one or other of the two schemes) and both schemes may incorporate the present invention, in embodiments described herein. The two schemes are differentiated by the materials used to make the interconnecting conductors linking the circuit elements. In one scheme, metal interconnects are disposed in aluminium metal in each layer of interconnect. Connections between each interconnect layer are made with short tungsten pillars (plugs). In the second scheme, typically used in circuits with smaller device geometries, the metal interconnect layers and the connections between layers are made in copper metal. In both schemes, the lightwells are made in these materials and are independent of any technology used to make the chip circuit elements on the silicon surface.

It will be apparent from the foregoing description that many modifications or variations may be made to the above described embodiments without departing from the invention. Such modifications and variations include:

In alternative embodiments, one or more light sensors 409 can be placed at the bottom of each lightwell. If an attack is attempted on a chip according to embodiments of the present invention, the only possible entry point for light is through one of the lightwells. A light sensor 409 placed at the bottom of the lightwell will detect an attack and can be used to enable the chip to detect attack attempts so that it can take relevant precautions (e.g. disable application software). Light arriving at a light sensor 409 placed at the base of a lightwell will necessarily be of much greater intensity than any light penetrating through the walls of the lightwell, and is therefore easily detected.

In alternative embodiments, the security chip may also be protected by an active shield to protect the chip from other classes of attack. Active shields are networks of circuit tracks covering a circuit which, if cut or short-circuited to each other, actively halt chip operation. Therefore, a breach in the active shield results in the disabling of some or all of the chip functions. Preferably, the top metal circuit layer is used as an active shield. The active shield is also preferably placed on top of the chip to protect both the passive shield and the rest of the chip below the passive shield. The active shield also has the effect of scattering any light directed at it. If a light sensor similar to light sensor 409 is present at the base of the lightwell, the scattering of the light might cause the light to hit the light sensor, which will trigger defence mechanisms in the circuit as described previously.

Delamination of current security chips through stress is a result of the large difference in coefficients of thermal expansion between aluminium (22 ppm/K) or copper (16.5 ppm/K) and silicon dioxide (0.6 ppm/K). If a material other than aluminium or copper is used to manufacture the passive shield (i.e. a material having a coefficient of thermal expansion closer to that of silicon dioxide), it is also possible to make a complete, contiguous and mechanically sound passive shield to cover the entire chip surface. For example, the use of invar, a steel based alloy specifically designed to be of low thermal expansion coefficient, has been found to substantially obviate the delamination problem. The use of invar in the manufacture of security chips was, prior to this invention, unknown.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited by what has been particularly shown and described hereinabove. Rather the scope of the invention is defined by the appended claims and equivalents thereof.

What is claimed is:

1. A security chip comprising:
   a substrate;
   an integrated circuit disposed on said substrate, said integrated circuit comprising circuit elements, circuit interconnect layers connecting said circuit elements together in one or more metal layers, and interlayer contacts interconnecting said one or more metal layers and said circuit elements;
   a shield provided over said integrated circuit to at least partially shield said integrated circuit from light; and
   at least one lightwell in said shield and said integrated circuit forming a path for light to penetrate through said shield to said substrate, wherein each lightwell has a closed shape formed by lightwell walls, said lightwell walls being formed in said integrated circuit from parts of said one or more metal layers and interlayer contacts on which no exploitable voltage can be measured when said parts are probed during an attack on said security chip.

2. The security chip of claim 1, wherein said parts of said one or more metal layers and interlayer contacts are connected to a constant voltage circuit element of said integrated circuit.

3. The security chip of claim 2, wherein said parts of said one or more metal layers and interlayer contacts are connected to a ground potential of said integrated circuit.

4. The security chip of claim 1, wherein said closed shape comprises a ring.

5. The security chip of claim 4, wherein said ring comprises a square ring.

6. The security chip of claim 1, wherein spaces between said interlayer contacts are sufficiently small to block all visible and infra-red light.

7. The security chip of claim 6, wherein said interlayer contacts are spaced less than or equal to 0.18 microns apart.

8. The security chip of claim 1, wherein said at least one lightwell has a lightwell width and is separated from further lightwells by a distance greater than or equal to ten times said lightwell width.

9. The security chip of claim 1, further comprising one or more light sensors at the base of one or more lightwells.

10. The security chip of claim 1, wherein said exploitable voltage comprises a varying voltage, the variation in voltage correlating with a sensitive data value.

11. A method of manufacturing a security chip, the method comprising:
    providing a substrate;
    disposing an integrated circuit on said substrate, said integrated circuit comprising circuit elements, circuit interconnect layers connecting said circuit elements together in one or more metal layers, and interlayer contacts interconnecting said one or more metal layers and said circuit elements;
    providing a shield over said integrated circuit to at least partially shield said integrated circuit from light; and
    forming at least one lightwell in said shield and said integrated circuit, said at least one lightwell forming a path for light to penetrate through said shield to said substrate, wherein each lightwell has a closed shape formed by lightwell walls, said lightwell walls being formed in said integrated circuit from parts of said one or more metal layers and interlayer contacts on which no exploitable voltage can be measured when said parts are probed during an attack on said security chip.

* * * * *

UNITED STATES PATENT AND TRADEMARK OFFICE
CERTIFICATE OF CORRECTION

PATENT NO. : 8,410,583 B2  
APPLICATION NO. : 12/733188  
DATED : April 2, 2013  
INVENTOR(S) : Walker et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 349 days.

Signed and Sealed this
First Day of September, 2015

Michelle K. Lee
*Director of the United States Patent and Trademark Office*